US010655219B1

(12) United States Patent
Finley et al.

(10) Patent No.: US 10,655,219 B1
(45) Date of Patent: May 19, 2020

(54) CONTAINMENT STRUCTURE FOR CREATING COMPOSITE STRUCTURES

(75) Inventors: John E. Finley, Liberty Lake, WA (US); Mark R. Wolke, Spokane, WA (US); Mark K. Lentz, Spokane Valley, WA (US)

(73) Assignee: GOODRICH CORPORATION, Charlotte, NC (US)

( * ) Notice: Subject to any disclaimer, the term of this patent is extended or adjusted under 35 U.S.C. 154(b) by 784 days.

(21) Appl. No.: 12/423,680

(22) Filed: Apr. 14, 2009

(51) Int. Cl.
*C23C 16/455* (2006.01)
*C23C 16/44* (2006.01)
*C23C 14/54* (2006.01)

(52) U.S. Cl.
CPC .......... *C23C 16/455* (2013.01); *C23C 14/541* (2013.01); *C23C 16/4412* (2013.01)

(58) Field of Classification Search
CPC . C23C 16/045; C23C 16/458; C23C 16/4411; C23C 16/4583; H01L 21/6719; H01L 21/67196; H01L 21/67207; Y10S 427/10; B29C 33/0033; B29K 2105/06
USPC ..... 118/724, 728; 428/66; 188/218, 218 XL; 188/251 R; 427/249.2, 255.12, 900; 264/257, 29.5, 29.1, 434; 156/89.26; 422/239; 432/241; 442/148, 179; 65/427; 501/35, 90
See application file for complete search history.

(56) References Cited

U.S. PATENT DOCUMENTS

| | | | | |
|---|---|---|---|---|
| 3,635,771 A | * | 1/1972 | Shaw | C23C 16/455 117/99 |
| 4,401,689 A | * | 8/1983 | Ban | 427/589 |
| 4,403,567 A | * | 9/1983 | daCosta | H01L 21/6838 118/50 |
| 4,580,524 A | * | 4/1986 | Lackey, Jr. | C04B 30/02 118/724 |
| 4,745,088 A | * | 5/1988 | Inoue et al. | 117/98 |
| 4,832,715 A | * | 5/1989 | Naruse | 96/221 |
| 4,860,545 A | * | 8/1989 | Zwick et al. | 62/50.6 |
| 4,895,108 A | * | 1/1990 | Caputo et al. | 118/728 |
| 5,041,719 A | * | 8/1991 | Harris | C23C 14/243 118/725 |
| 5,052,339 A | * | 10/1991 | Vakerlis et al. | 118/723 E |
| 5,078,091 A | * | 1/1992 | Stewart | 118/719 |
| 5,221,354 A | * | 6/1993 | Rigney | C23C 10/06 118/715 |
| 5,264,039 A | * | 11/1993 | Gobush et al. | 118/724 |
| 5,480,678 A | * | 1/1996 | Rudolph | C04B 35/83 118/715 |
| 5,556,275 A | * | 9/1996 | Sakata et al. | 432/241 |
| 5,807,792 A | * | 9/1998 | Ilg et al. | 438/758 |
| 5,900,297 A | * | 5/1999 | Rudolph et al. | 428/66.2 |

(Continued)

*Primary Examiner* — Karl Kurple
(74) *Attorney, Agent, or Firm* — Snell & Wilmer, L.L.P.

(57) ABSTRACT

A containment structure is disclosed for holding a substrate (e.g., preform) during CVI/CVD treatment. The containment structure includes a support structure, a cover portion, a gas inlet and a gas outlet. During the CVI/CVD process, the substrate is contained within the containment structure, forming a first space between the support structure and the substrate, and a second space between the substrate and the cover portion. Reactant gas is introduced into the first space and forced through the substrate via delta pressure, forming a binding matrix within the substrate. Excess reactant gas exits the substrate into the second space and is removed from the containment structure through the gas outlet.

8 Claims, 6 Drawing Sheets

(56) References Cited

U.S. PATENT DOCUMENTS

| | | | |
|---|---|---|---|
| 5,904,957 A * | 5/1999 | Christin | C23C 16/045 427/248.1 |
| 6,162,298 A * | 12/2000 | Rudolph | C23C 16/045 118/715 |
| 6,180,170 B1 * | 1/2001 | Grossmann | C23C 10/06 118/728 |
| 6,228,424 B1 * | 5/2001 | de Nora et al. | 427/243 |
| 6,406,544 B1 * | 6/2002 | Stewart | 118/719 |
| 6,575,062 B2 * | 6/2003 | Hahn | 81/460 |
| 6,576,565 B1 * | 6/2003 | Chakravarti et al. | 438/758 |
| 6,716,289 B1 * | 4/2004 | Sillmon | C23C 16/4412 118/715 |
| 6,744,023 B2 * | 6/2004 | Garn et al. | 219/632 |
| 7,182,980 B2 * | 2/2007 | Goujard | C04B 41/4531 427/248.1 |
| 7,488,688 B2 * | 2/2009 | Chung et al. | 438/706 |
| 7,641,434 B2 * | 1/2010 | Kurita et al. | 414/217 |
| 7,892,646 B1 * | 2/2011 | Rudolph | C23C 16/045 428/408 |
| 7,900,579 B2 * | 3/2011 | Inoue et al. | 118/641 |
| 8,230,806 B2 * | 7/2012 | Inoue et al. | 118/641 |
| 8,337,620 B2 * | 12/2012 | Pei | 118/726 |
| 8,475,596 B2 * | 7/2013 | Pei | 118/726 |
| 8,491,963 B2 * | 7/2013 | Lamouroux et al. | 427/249.2 |
| 8,500,909 B2 * | 8/2013 | Pei | 118/726 |
| 8,741,064 B2 * | 6/2014 | Inoue et al. | 118/724 |
| 8,770,143 B2 * | 7/2014 | Endo et al. | 118/723 R |
| 2001/0035124 A1 * | 11/2001 | Okayama et al. | 118/110 |
| 2001/0042744 A1 * | 11/2001 | Tachikawa et al. | 219/444.1 |
| 2002/0056292 A1 * | 5/2002 | Kamio et al. | 65/424 |
| 2002/0069970 A1 * | 6/2002 | Noorbakhsh et al. | 156/345.37 |
| 2003/0010291 A1 * | 1/2003 | Song | 118/724 |
| 2004/0224110 A1 * | 11/2004 | Jimbo et al. | 428/35.7 |
| 2005/0178327 A1 * | 8/2005 | Rudolph | C23C 16/045 118/715 |
| 2006/0216548 A1 * | 9/2006 | Mao | C23C 16/402 428/701 |
| 2006/0266852 A1 * | 11/2006 | Choi | B05B 1/185 239/548 |
| 2007/0122580 A1 * | 5/2007 | Krall et al. | 428/38 |
| 2008/0152803 A1 * | 6/2008 | Lamouroux et al. | 427/248.1 |
| 2009/0211525 A1 * | 8/2009 | Sarigiannis et al. | 118/707 |
| 2009/0258504 A1 * | 10/2009 | Nakaiso et al. | 438/758 |
| 2009/0291566 A1 * | 11/2009 | Ueno et al. | 438/758 |
| 2010/0307416 A1 * | 12/2010 | Park et al. | 118/724 |
| 2011/0070370 A1 * | 3/2011 | Teo et al. | 427/255.28 |
| 2012/0272892 A1 * | 11/2012 | Paranjpe et al. | 117/86 |
| 2012/0285374 A1 * | 11/2012 | Pei | 118/47 |
| 2013/0087099 A1 * | 4/2013 | Choi | 118/724 |
| 2015/0176126 A1 * | 6/2015 | Ge | C23C 14/22 137/240 |
| 2017/0062189 A1 * | 3/2017 | Weng | C23C 16/045 |

* cited by examiner

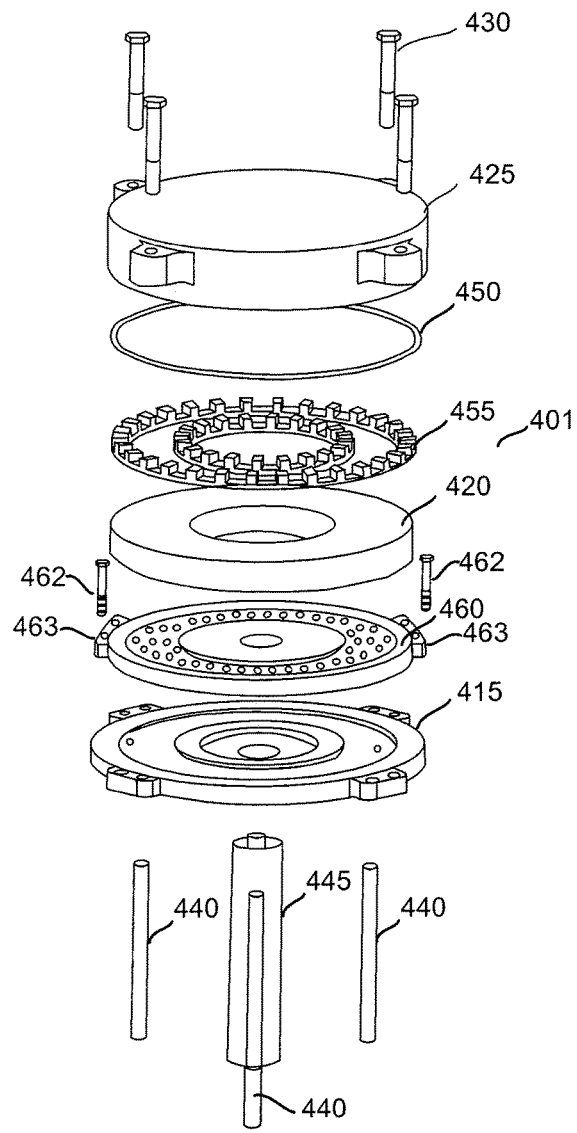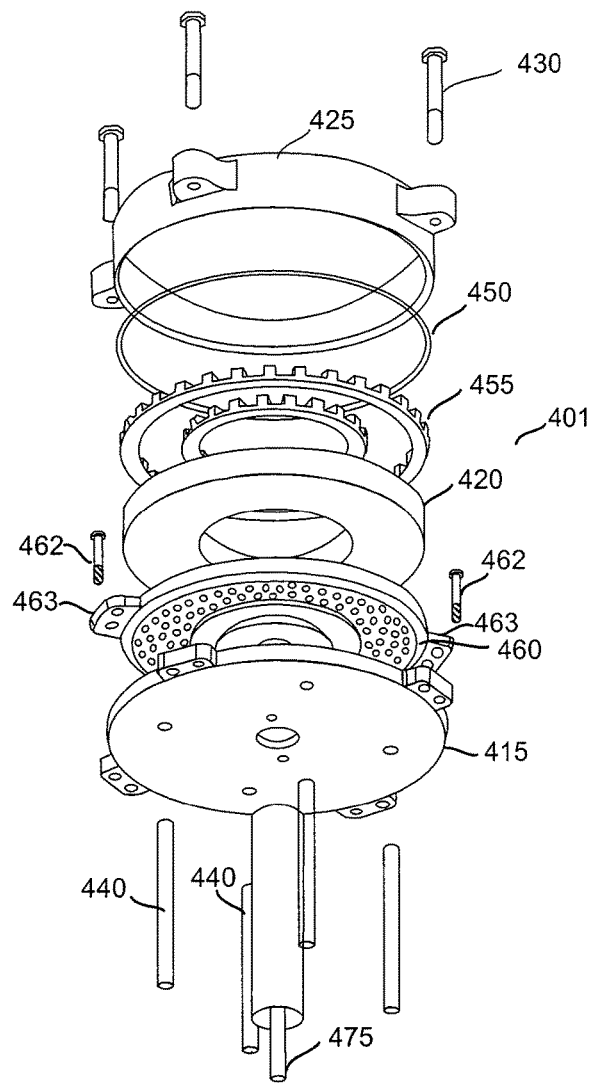
Figure 4A
Figure 4B

CONTAINMENT STRUCTURE FOR CREATING COMPOSITE STRUCTURES

FIELD OF INVENTION

The present invention generally relates to creating composite structures, and more particularly, to containment devices which use CVI/CVD processes for creating composite structures.

BACKGROUND OF THE INVENTION

Chemical vapor infiltration and chemical vapor deposition (CVI/CVD) are well-known processes for forming high-performance composite materials. In particular, CVI/CVD is a useful process for fabricating structural composites such as, for example, brake disks, combustors and turbine components.

In general, the term "chemical vapor infiltration" (CVI) includes deposition of a matrix within the pores of a substrate, and "chemical vapor deposition" (CVD) includes deposition of a surface coating on a substrate. However, as used herein, the term CVI/CVD is intended to refer generally to infiltration and deposition of a matrix on and/or within a substrate.

CVI/CVD generally involves passing a gas (e.g., methane, propane, etc.) comprising a reactant component (e.g., carbon) around and through a substrate. The reactant component deposits on and within the pores of the substrate to form a composite structure. When the substrate and reactant component both comprise carbon, for example, a carbon/carbon composite material is formed.

The term "composite structure", as used herein, refers to a substrate treated using CVI/CVD to contain a solid residue dispersed on and/or in the substrate. In an exemplary embodiment, the composite structure may comprise a substrate made of carbon having a solid carbon residue dispersed within. This may be referred to as a carbon/carbon composite.

In some conventional CVI/CVD processes, several substrates are stacked within a densification process chamber (i.e., a furnace) in order to increase the number composite structures produced per batch. During the process, the parameters within the chamber (i.e., temperature, pressure and flow rate of the gas) are controlled and/or varied to facilitate the deposition of the matrix within the substrate and create the composite structures.

However, there are several disadvantages associated with such conventional systems and methods for performing CVI/CVD. For example, using conventional CVPCVD processes, the temperature and pressure gradients are likely to vary at different locations within the chamber. As such, the rate and amount of deposition of the matrix in the substrates is likely to vary based upon the location of the substrate within the chamber, creating non-uniform composite structures.

However, the exhaust systems of such CVI/CVD densification systems tend to be less efficient and often require more power to operate. Such systems typically result in the undesirable formation of soot on the substrates, as well as build-up of carbon residue within the chamber, often requiring shut down of the system for cleaning and maintenance.

As such, improved system and methods for performing CVI/CVD that increase uniformity of the composite structures and efficacy of the CVI/CVD process while allowing quick unloading and reloading of the process chamber are desired.

SUMMARY OF THE INVENTION

In various embodiments, a containment structure comprises a support structure, a cover portion, a gas inlet and a gas outlet, and the containment structure holds a substrate during CVI/CVD treatment. Although described herein as "a substrate," one skilled in the art will appreciate there may be more than one substrate in any of the embodiments. Moreover, although referred to as a "substrate" herein, one skilled in the art will appreciate that a "substrate" may also include or be referred to as a "preform."

A substrate may be placed within the containment structure, forming a first space between the support structure and the substrate, and a second space between the substrate and the cover portion. Reactant gas is introduced into the first space via the gas inlet and forced through the substrate via delta pressure, forming a binding matrix within. Excess reactant gas exits the substrate into the second space and is removed from the containment structure via the gas outlet.

The gas outlet may be located in substantially the center of the support structure, and one or more gas inlets may be located on either side of the gas outlet. The containment structure may further comprise any of a seal component, a spacer component, a diffuser, one or more controllers and/or gauges to control process conditions during CVI/CVD treatment.

The containment structure may be incorporated into a process chamber as part of a CVI/CVD treatment system. The process chamber may comprise a base portion and a shell portion that encapsulate the containment structure. The process chamber may further comprise a cooling element and/or heating element in thermal communication with the substrate. For example, a cooling element may be positioned below the containment structure, and/or a heating element may be positioned along the top or side of the containment structure to form a thermal coupling with the substrate.

In various embodiments, one or more components of the containment structure may be pre-formed outside the process chamber to facilitate quick loading and unloading of the process chamber.

The position of the cooling element may be adjustable relative to the containment structure. For example, the cooling element may be connected to the cooling media inlet and/or cooling media outlet, such that movement of the cooling media inlet and/or cooling media outlet controls movement of the cooling element. Moreover, in some embodiments, an insulation material may be inserted between the cooling element and the containment structure to decrease heat transfer.

BRIEF DESCRIPTION OF THE DRAWINGS

FIGS. 4A and 4B illustrate exploded views of an exemplary embodiment of a containment structure;

DETAILED DESCRIPTION

The detailed description of exemplary embodiments herein makes reference to the accompanying drawings, which show exemplary embodiments for purposes of illustration and its best mode, and not of limitation. While these exemplary embodiments are described in sufficient detail to enable those skilled in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

In general, the system includes a containment structure for holding a substrate during CVI/CVD treatment. Exemplary containment structures for performing CVI/CVD are disclosed in U.S. patent application Ser. No. 12/257,712 (the '712 application) entitled PROCESS AND APPARATUS FOR MAKING COMPOSITE STRUCTURES (claiming priority to U.S. Ser. No. 60/982,807) and U.S. patent application Ser. No. 12/257,707 entitled COMPOSITE STRUCTURE (claiming priority to U.S. Ser. No. 60/982,788) which are all herein incorporated by reference in their entirety. The system and method described herein is useful for implementing the system and process described by the '712 application. For example, in various embodiments, the system and method described herein allows for the efficient loading and unloading of substrates into the process chamber (e.g., furnace) described in the '712 application.

In various exemplary embodiments, the containment structure comprises a support structure, a cover portion, a gas inlet and a gas outlet.

Figure 1:
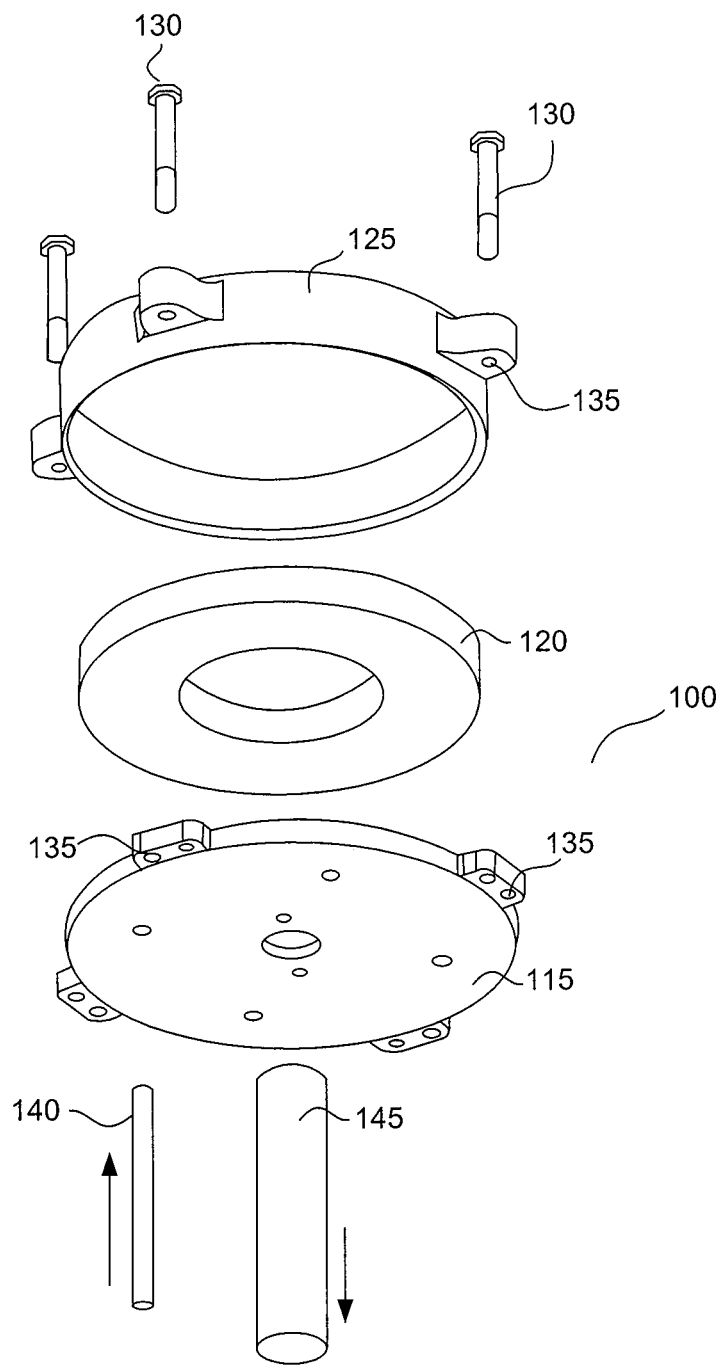
FIG. 1 illustrates an exploded view of an exemplary embodiment of a containment structure.

As used herein, "support structure" includes any device, apparatus, and/or system capable of supporting a substrate. For example, a support structure may comprise a plate, disc or other platform. FIG. 1 illustrates an exemplary embodiment of a containment structure 100 comprising support structure 115 in the form of a base plate.

As used herein, "substrate" includes any material capable of being treated by chemical vapor deposition and/or infiltration. FIG. 1 illustrates an exemplary embodiment of substrate 120 operable for placement on support structure 115.

In an exemplary embodiment, the substrate comprises a porous material. The porous material may be any material that comprises sufficient pore size and volume to permit a gas to infiltrate the pores under reaction conditions to form a solid residue therein (e.g., as a result of thermal decomposition). Examples of suitably porous materials include, for example, carbon, silicon, boron, silicon carbide, silicon nitride, aluminum nitride, titanium nitride, boron carbide, cubic zirconia and/or the like, or a mixture of two or more thereof.

In accordance with various embodiments, the porous material is formed from a fibrous material, such as carbon fibers and the like. The carbon fibers may be derived from polyacrylonitrile, rayon (synthetic fiber derived from cellulose), pitch and the like. In an embodiment, the porous substrate is formed in a non-woven process. In other embodiments, the porous substrate is formed by twisting together or otherwise joining the fibers to form a fiber yarn. The yarn is then woven, braided, knitted or otherwise joined into layers of fibrous material. The layers are then combined to form the porous substrate. In other embodiments, the substrate comprises a substantially solid material. However, the invention contemplates that the substrate may comprise any material (whether porous or solid) that is capable of being treated by CVD and/or CVI.

The substrate itself may comprise any desired shape or form. For example, the substrate may be in the form of a polygon, such as a triangle, a square, rectangle, pentagon, hexagon, octagon, and the like. The substrate may be other shapes, including symmetrical shapes, asymmetrical shapes, or in the form of a circular or annular disk.

In an exemplary embodiment, the substrate undergoes treatment prior to the CVI/CVD process. For example, the substrate may be partially or fully heated and/or pressurized (such as in a vacuum or an inert atmosphere). The substrate may be heated at a temperature in the range from about 1400 to about 2800° C., and more specifically, in the range from about 1600 to about 2200° C., for a period of time up to about 60 hours. When the substrate comprises carbon or is formed using carbon fibers, this heat treating step may be referred to as a carbonizing step, and the heat treated substrate may be referred to as a carbonized substrate.

As discussed above, the containment structure comprises a cover portion. As used herein, a "cover portion" is a structure capable of removably attaching to the support structure to create a compartment (e.g., for containing a substrate within). In an exemplary embodiment, the cover portion comprises an attachment means such as bolts, screws, pins, and/or the like to suitably mate with the support structure. For example, FIG. 1 illustrates an exemplary embodiment in which the attachment means comprises bolt 130 for insertion into cover portion 125. Bolt 130 is operable to mate with openings 135 on support structure 115 and cover portion 125.

The upper edge of the support structure may be stepped radially inward to facilitate attachment of the cover portion. The upper edge of the support structure may have a groove, twist-lock mechanism, ribbing, threads and/or clamps to facilitate the cover portion being snapped, screwed, twisted, clamped, and/or otherwise attached onto the support structure. Any known or hereinafter devised structure or means of attaching cover portion to the support structure may be used.

In an embodiment, the shapes of the support structure and/or the cover portion conform substantially to the shape of the substrate. Moreover, the support structure and cover portion may be bigger than the substrate to contain the substrate within. For example, FIG. 1 illustrates support structure 115 and cover portion 125 having a substantially circular shape to conform to the circular periphery of substrate 120. However, the system contemplates that the support structure and cover portion may be any desired size and/or shape.

Figure 2:
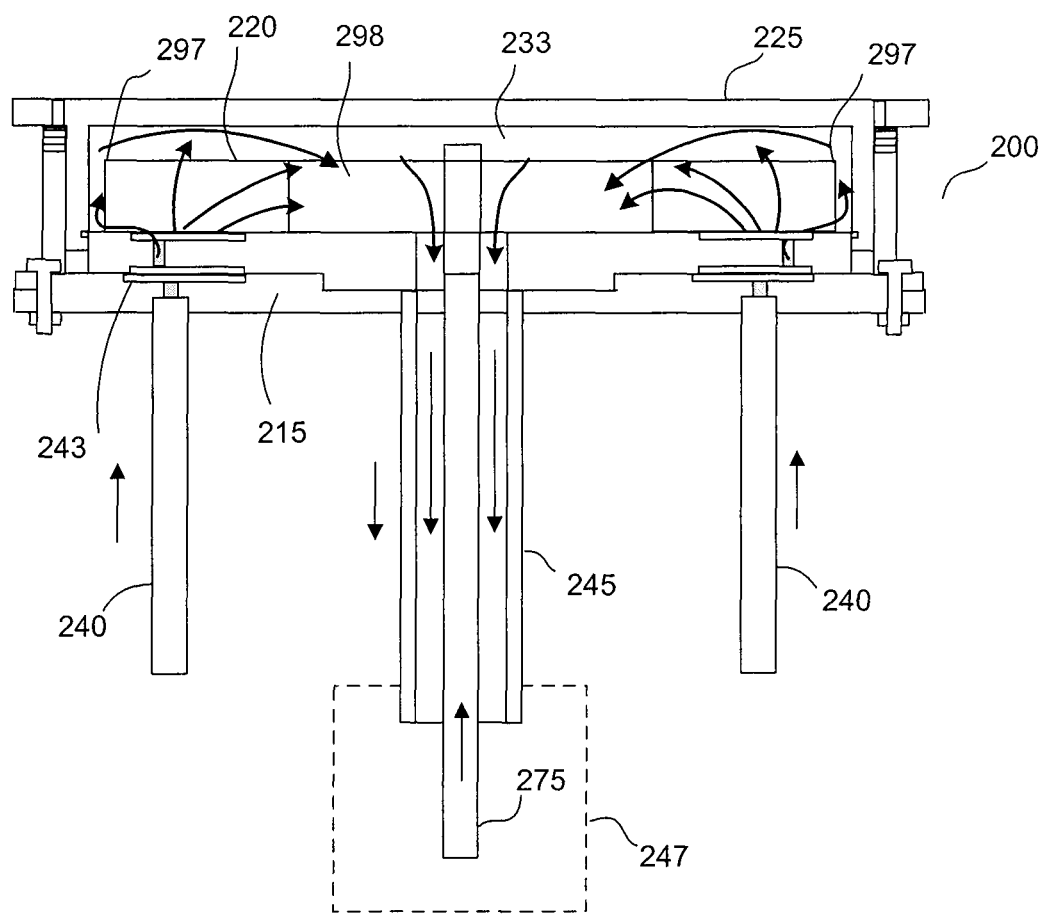
FIG. 2 illustrates an assembled view of an exemplary embodiment of a containment structure and provides an exemplary schematic illustrating the flow of reactant gas within the containment structure.

The containment structure may further comprise a gas inlet. A gas inlet may be a structure or system capable of delivering a gas to the interior of a containment structure. FIG. 1 illustrates gas inlet 140 operable for insertion into containment structure 100 via support structure 115. Although FIG. 1 illustrates a single gas inlet 140, the containment structure may comprise any number of gas inlets. For example, FIG. 2 illustrates two gas inlets 240 and FIGS. 4A and 4B illustrate four gas inlets 440 comprising tubes which enter the interior of containment structure 200/401 via support structure 215/415. Although the gas inlets are shown in FIG. 2 and FIG. 4 as entering the containment structure via the support structure, in certain embodiments, the gas inlet may be positioned at other locations on the containment structure. Moreover, the gas inlet may be any desired length and/or diameter. In one embodiment, the length and/or diameter of the gas inlet are selected to control the flow of gas feed to the interior of the containment structure.

The gas delivered via the gas inlet may be any gas having one or more components capable of decomposing to form a solid residue on or within the substrate. In an exemplary embodiment, the reactant gas comprises a reactant component and/or a carrier component.

The reactant component may comprise a precursor or other substance capable of forming a residue upon thermal decomposition. For example, when carbon is the desired residue (as in the formation of carbon/carbon composites), the reactant component may comprise one or more hydrocarbons. Suitable hydrocarbons include alkanes such as straight chain, branched chain and/or cyclic alkanes. The alkane may have, for example, from about 1 to about 8 carbon atoms, and more specifically, from about 1 to about 6 carbon atoms, and more specifically, from about 1 to about 3 carbon atoms. Examples of alkanes include methane, ethane, propane, cyclopentane, or mixtures thereof. In an embodiment, the reactant component comprises methyltricholorosilane (MTS), which may be used, for example, in silicon carbide deposition. In an embodiment, the reactant component comprises one or more alkenes, having for example about 2 to about 8 carbon atoms, alone or in addition to one or more alkanes. In various embodiments, the reactant component comprises alkynes, such as acetylene. In various embodiments, the reactant component comprises a ceramic material.

The carrier component may comprise a gas suitable to carry and/or dilute the reactant component. The carrier component may comprise hydrogen, nitrogen, helium, argon, or a mixture of two or more thereof. It will be understood that the carrier component may comprise any diluent and/or inert gases.

The containment structure may further comprise a gas outlet. In general, a gas outlet is a structure, device or system capable of removing an unreacted reactant gas and/or byproduct gases generated during the CVI/CVD process from the containment structure. FIG. 1 illustrates gas outlet 145 operable for insertion into containment structure 100 via the center of support structure 115. However, the system contemplates that the gas outlet may be positioned at other locations on the containment structure, such as connected to the cover portion. Moreover, the gas outlet may be any desired length and/or diameter.

As noted above in FIG. 1, containment structure 100 comprises a single gas inlet 140 and a single gas outlet 145, though, in other embodiments, the containment structure may comprise any number of gas inlets and outlets. For example, FIGS. 4A and 4B illustrate an exemplary embodiment of a containment structure 401 comprising gas outlet 445 surrounded by four gas inlet tubes 440. The gas outlet may be connected to a vacuum system or other suction means to facilitate the removal of the gas and/or alter the pressure within the containment structure.

FIG. 2 illustrates an exemplary embodiment of the flow of reactant gas within a containment structure. As shown, the reactant gas enters containment structure 200 via gas inlets 240. The reactant gas disperses in first open space 243 (shown in FIGS. 5A and 5B as open space 590 adjacent diffuser component 560) located between support structure 215 and annular substrate 220 and flows through inner diameter (ID) 298 and outer diameter (OD) 297 and second open space 233. The reactant gas infiltrates substrate 220 and deposits a solid matrix within the pores. The excess gas and byproducts then exit containment structure 200 via gas outlet 245. In an embodiment, vacuum component 247 facilitates removal of the excess reactant gas and byproducts from containment structure 200.

A containment structure may further comprise a seal component. A seal component is any device, structure or system that creates a partial or full seal between two or more components of the containment structure. The seal component may comprise suitable materials for creating a seal, such as graphite, metals, polymeric materials, and the like. In some embodiments, the material does not fully or partially swell or distort due to temperature or pressure change.

Figure 3:
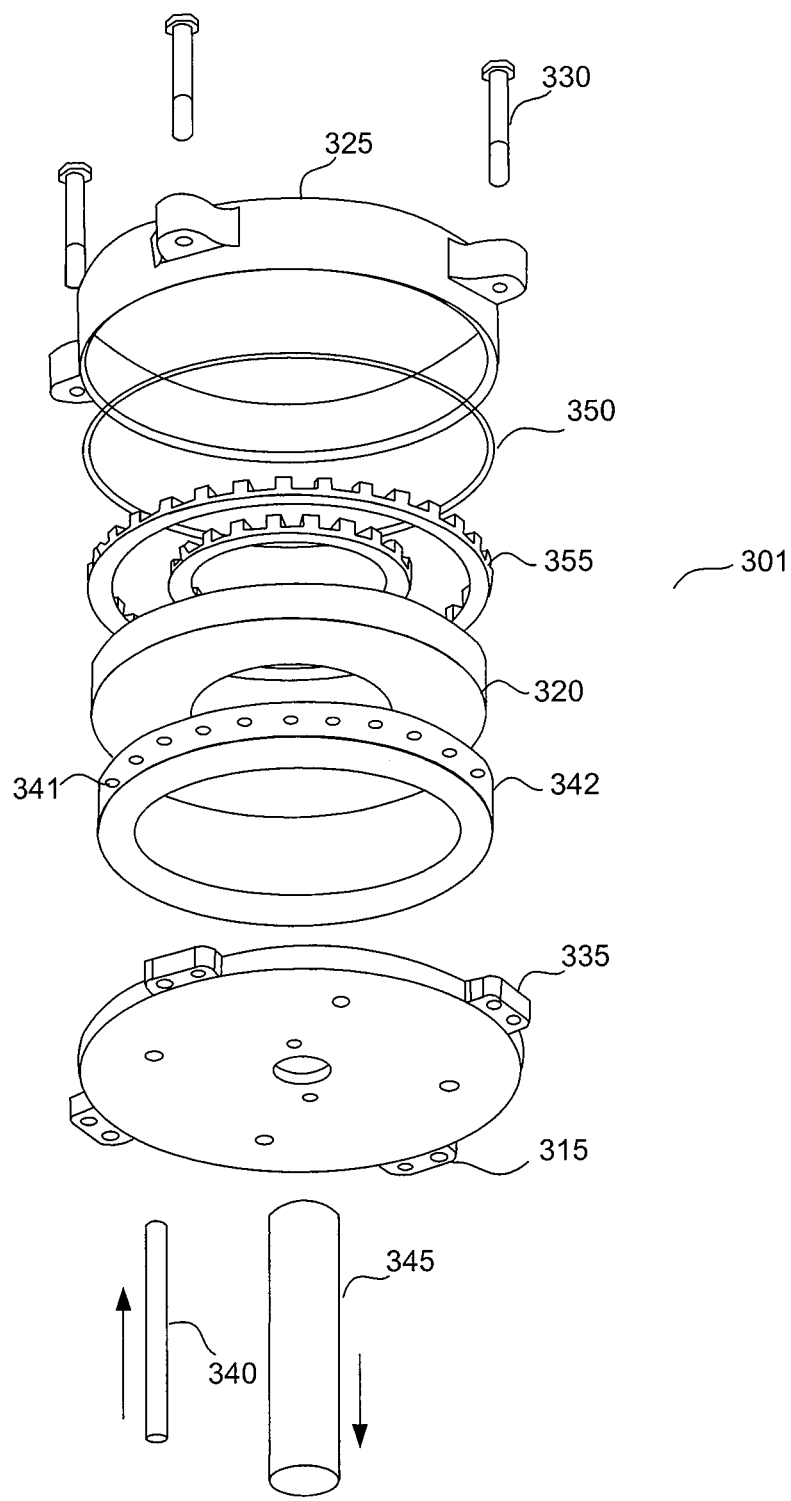
FIG. 3 illustrates an exploded view of an exemplary embodiment of a containment structure.

In accordance with the exemplary embodiment shown in FIGS. 3, 4A, and 4B, seal component 350/450 comprises a ring operable to be positioned between cover portion 325/425 and support structure 315. It will be understood that the seal component may be omitted, or one or more seal components may be placed at any desired position(s) within the containment structure. Moreover, the seal component may be formed separately from the containment structure and then mounted on the containment structure, or may be formed integrally with the containment structure.

The containment structure may further comprise one or more spacer components. A spacer component may be any device or structure which creates a space between one or more components of the containment structure and allows gas flow through the spacer. In an embodiment, the spacer component is smaller than the cover component to fit within the cover component when the containment structure is assembled. In an embodiment, the spacer component is sized to fit the substrate.

In one embodiment, such as that shown in FIGS. 4A and 4B, spacer component comprises concentric castellated rings 455 located between substrate 420 and cover 425 to create a space in the upper half of assembled containment structure 401. However, it will be understood that one or more spacer components may be positioned at any desired position(s) within the containment structure. For example, a spacer component may be located between the support structure and the substrate to create a space in the bottom half of the assembled containment structure. Moreover, in various embodiments, the spacer component may be perforated to allow gas flow from the inner diameter to the outer diameter.

A containment structure may further comprise a diffuser component. As used herein, a "diffuser component" includes any device, apparatus and/or system operable for dispersing gas entering the containment structure. FIGS. 4A and 4B illustrate an exemplary diffuser component 460 having reception means 463 for insertion of bolt 462. Diffuser 460 is positioned between support structure 415 and substrate 420. Diffuser 460 is attached to support structure 415 using bolts 462. It will be understood that the diffuser component may have any desired number and size of openings which suitably allow the reactant gas to pass to the substrate.

A containment structure may further comprise a gas bypass component. As used herein, a "gas bypass component" includes any device, apparatus, and/or system operable to provide a gas bypass or leakage between two or more components of the containment structure. In one embodiment, the gas bypass component comprises a ring device having openings to allow the gas to transfer between components of the containment structure. In an embodiment, the gas bypass component is positioned between the substrate and the diffuser plate at the outer diameter (OD) of the containment structure. Openings in the gas bypass component allow gas bypass between the first and second open space of the containment structure.

Figure 5A:
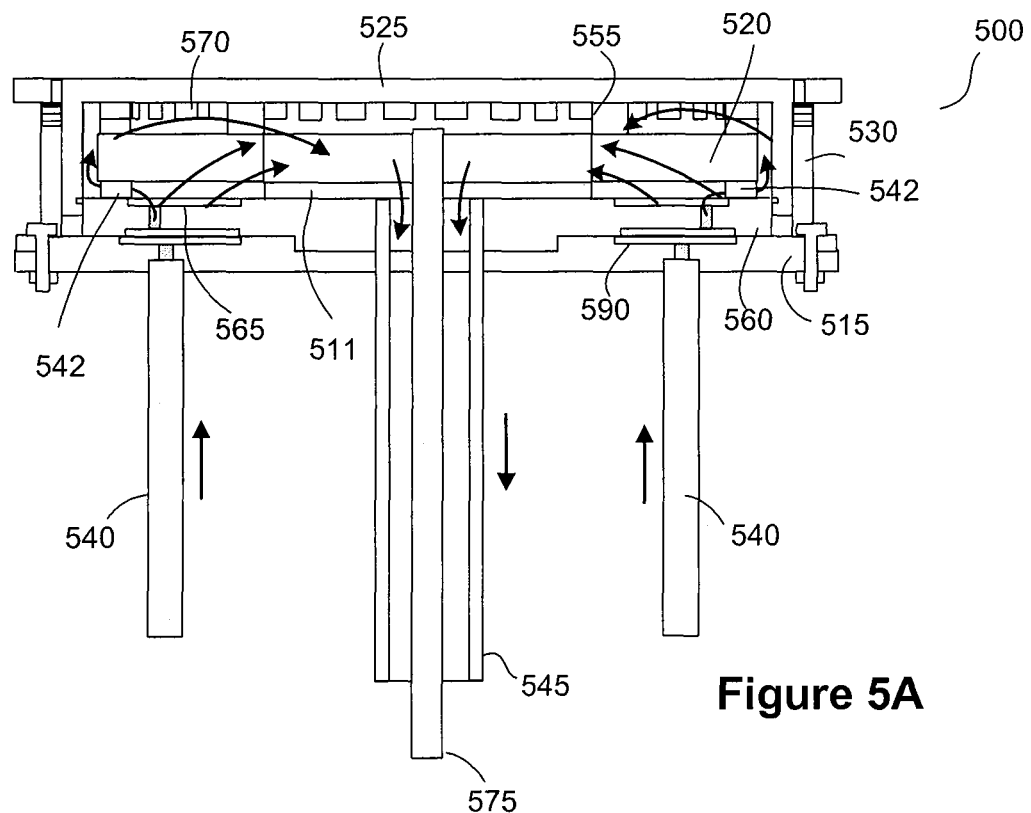
FIGS. 5A and 5B illustrate assembled views of an exemplary embodiment of a containment structure.
Figure 5B:
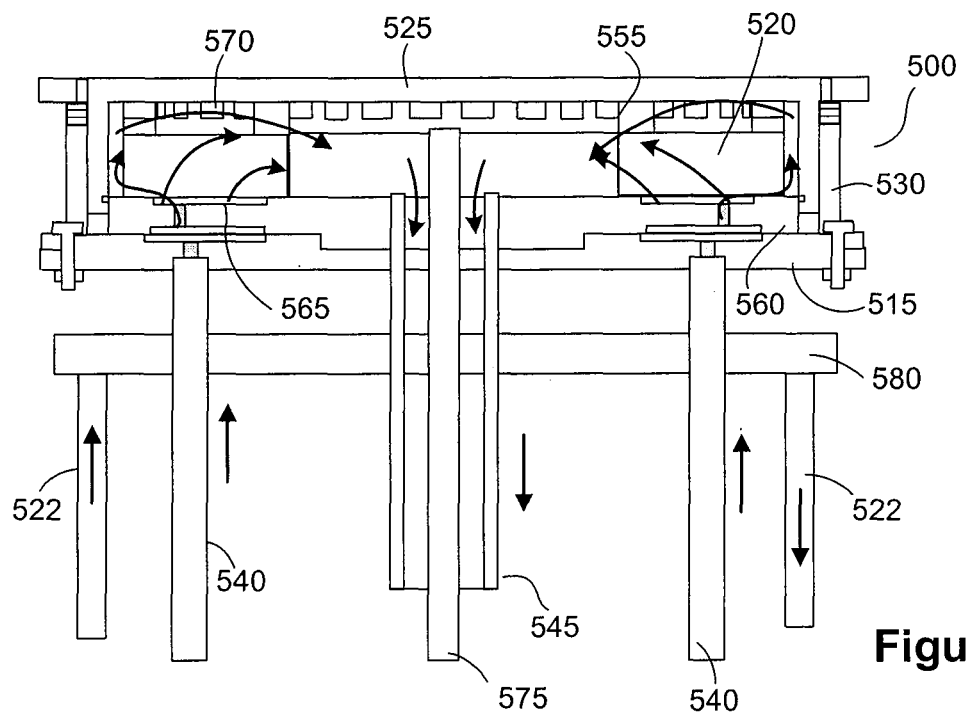

For example, FIGS. 3 and 5A illustrate exemplary gas bypass components 342/542 operable to allow gas to flow to the outer diameter of the substrate. In various embodiments, and as illustrated in FIG. 3, openings 341 extend in the radial direction along gas bypass component 342. However, it will be understood that the openings may be arranged in any suitable orientation and/or configuration. In various embodiments and as illustrated in FIG. 5A, containment structure 500 may further comprise ID support 511 to raise substrate 520 to the level of gas bypass component 542.

It will also be understood that the support structure, cover portion, spacer component, seal component, diffuser component, gas bypass component, and other components of the containment structure may be comprised of a sufficiently rigid material, such as ceramics, carbon and metals (including steel, or iron or combinations thereof) and/or the like.

FIG. 5 illustrates an exemplary embodiment of an assembled containment structure. As shown, diffuser component 560 is positioned on support structure 515 to create first open space 565 to permit the reactant gas to flow from gas inlets 540 into contact with substrate 520, which is positioned on top of diffuser component 560. Spacer component 555 rests on top of substrate 520 and contacts cover portion 525 to create second open space 570 to allow the reactant gas to escape from substrate 520 and exit containment structure 500 via gas outlet 545.

The size of second open space 570 may be minimized so as to reduce the amount of time the expelled reactant gas remains within containment structure 500. However, it will be understood that the second space may be any desired size.

In accordance with an exemplary embodiment, the diffuser component, substrate, spacer component, seal component, and/or the cover component form the containment structure. In various embodiments, one or more components of the containment structure may be pre-formed outside the process chamber to facilitate quick loading and unloading of the process chamber. For example, one or components may be assembled prior to attachment to a support structure. In various embodiments, the components may also be stacked sequentially onto a support structure prior to the attachment of the cover portion.

In an exemplary embodiment, the containment structure comprises a device or mechanism for actively cooling a surface of the substrate. For example, FIG. 2 illustrates containment structure 200 comprising conduit 275 within gas outlet 245, which allows a cool gas, such as nitrogen, to be piped up to the top surface of the substrate to increase the cool down rate. The cool gas is then drawn back down through gas outlet 245. In one embodiment, the gas inlet may be used as a cooling conduit that can be used to cool the substrate. In various embodiments, deflection plates may be inserted in the top portion of the containment structure to facilitate cool down of the substrate. It will be understood that any device or mechanism for cooling the top surface of the substrate may be used.

One or more gas inlets may be used to actively cool a surface of the substrate. For example, one or more gas inlets may deliver a cool gas (e.g., nitrogen), to a surface of a substrate, and one or more gas inlets may be used as an exhaust to remove the gas from the containment structure.

In an embodiment, the conduit further comprises instrumentation to measure the temperature and/or pressure of the gas in the space above the substrate. Moreover, although located within the gas outlet in FIG. 2, the conduit may be located in any desired position relative to the containment structure.

A containment structure may further comprise one or more controllers and/or gauges. For example, a containment structure may comprise one or more devices (such as thermometers, barometers and or pressure/temperature gauges) to control and/or measure the temperature and/or pressure within the containment structure. The containment structure may comprise a device (such as valves and/or gas blow controllers) to control and/or measure the inlet and/or outlet flow rate of the reactant gas. However, it will be understood that any structure or method of controlling and or measuring the temperature, power, pressure and/or flow rate within the containment structure may be used.

In an embodiment, all controllers and gauges are operated via a single instrument, such as a feedback instrument. However, it will be understood that in certain embodiments, any number of controllers and/or gauges may be used.

In various embodiments, a CVI/CVD process chamber is used with the containment structure.

Figure 6:
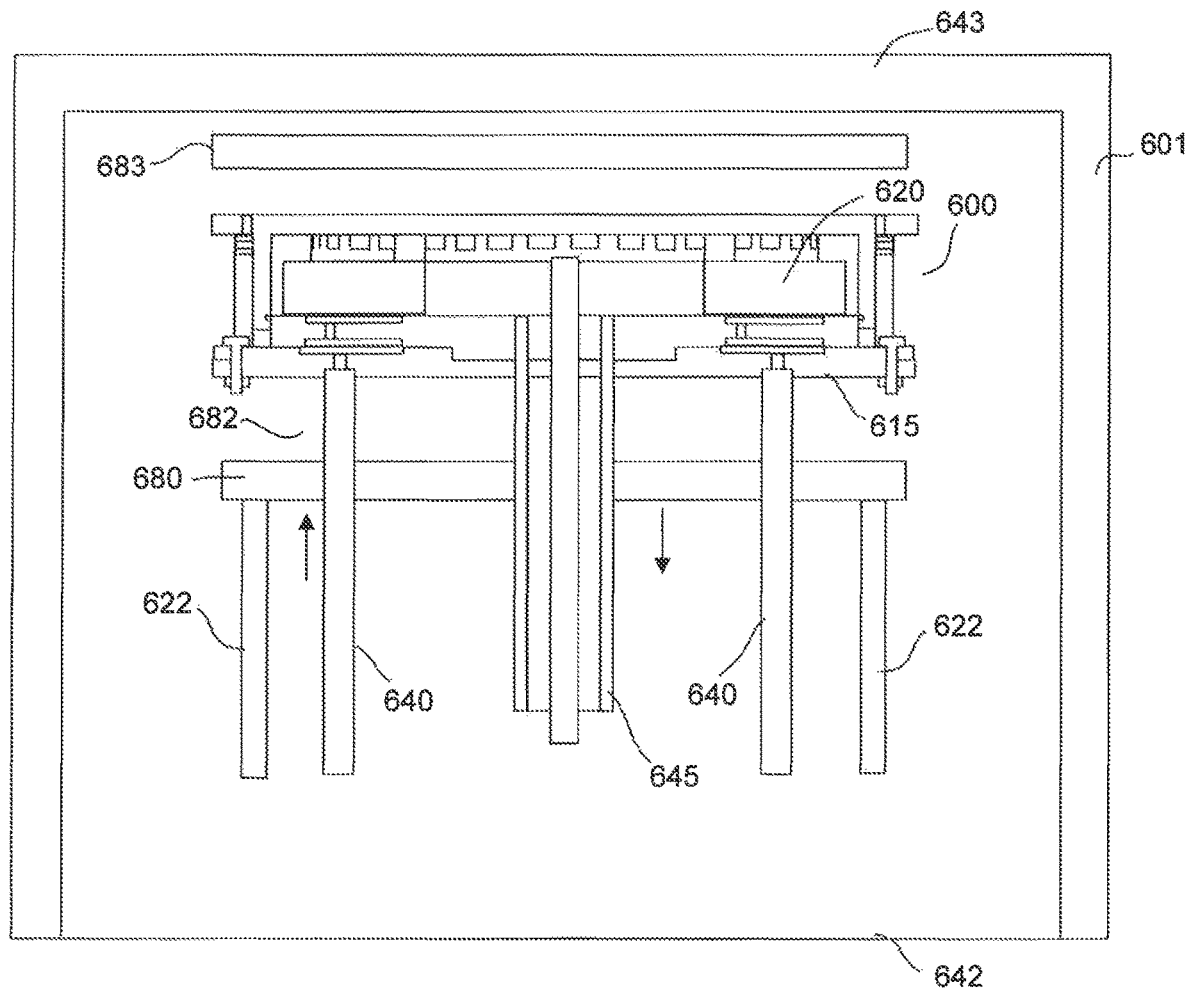
FIG. 6 illustrates a process chamber comprising a containment structure in accordance with an exemplary embodiment.

A process chamber such as described herein generally comprises a base portion, a shell portion and a containment structure. For example, FIG. 6 illustrates process chamber 601 comprising base portion 642, shell portion 643 and containment structure 600.

The base portion generally comprises a structure that suitably supports one or more containment structures. The shell portion may be any structure capable of removably attaching to the base portion to contain the containment structures within. The shell may comprise an attachment suitable for removably attaching the shell to the base portion, such as bolts, screws, pins, and the like. The base and shell portions may be made of a suitably rigid material, such as steel, carbon, graphite, and/or the like.

The process chamber may comprise additional components such as one or more heat exchangers, cleaning ports, temperature and pressure gauges, resistance heating elements and/or induction coils. The induction coils may comprise electrodes and/or coiled conductors encapsulated by electrical insulation. During operation, the induction coil develops an electromagnetic field that generates heat within the furnace. Insulation may be disposed in any desired location, such as in between the heat source and the induction coil. In an embodiment, insulation may be located below the containment structure, such as below the cooling element.

A process chamber may further comprise a cooling element. A cooling element may be a device or structure that cools all or a portion of a substrate. In an exemplary embodiment, the cooling element comprises a plate or other structure having one or more embedded cooling conduits or channels to allow fluid coolant to flow through the cooling element. Suitable fluid coolants such as water, air, nitrogen, oil, and the like may be used. The cooling element may also comprise one or more non-fluid cooling elements.

In accordance with the exemplary embodiment illustrated in FIG. 6, cooling element 680 comprises a plate beneath support structure 615 so as to be thermally coupled with the bottom surface of the substrate 620. However, the cooling element may be located in any desired position so as to be thermally coupled with the substrate. For example, the cooling element may be thermally coupled to the bottom surface of the support structure (shown in FIG. 6 as element 615). The support structure may also act as the cooling element.

As used herein, "thermally coupled" refers to two bodies, for example, a cooling source and the surface of a substrate, or a heating source and the surface of a substrate, that may or may not be in physical contact with each other or adjacent to each other but may still exchange heat with each other.

The position of the cooling element relative to the substrate may be adjusted. For example, the cooling element may be attached to one or more adjustable components of the containment structure, such that movement of the position of the components adjusts the position of the cooling element. For example, and with reference to FIGS. 5B and 6, one or more cooling media lines 522/622 (e.g., cooling media inlets and outlets) may be connected to cooling element 680, and the position of the cooling media lines 622 may be adjustable so as to simultaneously adjust the position of cooling element 680.

As shown, lowering cooling element 680 creates or increases space 682 between cooling element 680 and support structure 615. In an exemplary embodiment, the space may be filled with one or more insulation materials, which creates a barrier to decrease the cooling transfer from the cooling element to the substrate. Suitable insulation material such as, for example, alumina, fiberglass, slag wool, mineral wool, rock wool, ceramic fibers and/or carbon fibers may be used. Moreover, the insulation material may be in any suitable form, such as, for example, beads, capsules, liquid, and/or the like.

In an exemplary embodiment, a process chamber further comprises a heating element. A heating element is a device or structure that heats all or a portion of a substrate. The heating element may comprise a susceptor, resistance heating element and/or microwave heating element. An induction coil and/or insulation barrier may also be used in combination with the heating element. However, it will be understood that any device or structure suitable to heat all or a portion of the substrate may be used. As shown in FIG. 6, heating element 683 is thermally coupled with substrate 620. It will be understood that the heating element may be in any position suitable (on the top and/or on sides of the substrate) to provide heat to all or a portion of the substrate. In an embodiment, one or more components of the containment structure, such as the cover portion or the support structure, functions as the heating element.

In FIG. 6, process chamber 601 comprises cooling element 680 beneath substrate 620 and heating element 683 on top of substrate 620. During operation of process chamber 601 during the CVI/CVD process, the bottom surface of substrate 620 is relatively cold and the top surface of substrate 620 is relatively hot, resulting in a thermal gradient across the thickness of substrate 620. The reactant gas flows from gas inlet 640 into substrate 620, wherein at least part of the gas undergoes thermal decomposition and forms a solid residue in the pores and/or on the surface of the substrate. The gases that do not undergo thermal decomposition (i.e., the unreacted gases), as well as any by-product gases that may be generated during the densification process may flow through the substrate through the relatively hot surface and out of gas outlet 645. As the process continues, the build up of solid residue within the substrate may result in the gradual densification of substrate 620 and the formation of the composite structure.

The densification generally proceeds from the hot side of substrate 620 to the cold side of substrate 620. For example, in response to the top layer of the substrate reaching the reaction-critical temperature, the binding matrix forms.

In accordance with an exemplary embodiment, in response to the desired amount of binding matrix being deposited in the top portion of the substrate, the cooling element may be adjusted downward relative to the containment structure, causing the next portion of the substrate to reach the critical temperature and deposition to occur, and so on.

In an exemplary embodiment, the thermal gradient across the substrate may be varied during the CVI/CVD process in order to optimize the densification of the substrate. This may be accomplished by changing the temperature of the coolant in the cooling element, and/or changing the flow rate of the coolant in the cooling element.

The coolant may be chilled prior to entering the cooling element to increase the temperature differential between the substrate and the cooling element. This may increase the heat transfer rate between the substrate and the cooling element. The heat transfer may be decreased during the densification process by allowing the temperature in the cooling element to rise. The pressure within the cooling element may be increased to prevent or minimize the vaporization of the water.

In an exemplary embodiment, the coolant is water. In various embodiments, various oils with higher boiling points than water may be used as the coolant. Coolants with higher boiling points than water, or coolants in a gas phase, may be used to operate the cooling element at higher temperatures and thereby reduce the temperature differential between the cooling element and the substrate. The flow rate within the cooling element may be varied to vary the temperature within the cooling element. For example, a relatively high flow rate may tend to maintain the cooling element at a relatively cool temperature, and a relatively low flow rate may allow the temperature of the cooling element to increase.

Although discussed above with reference to thermal gradient CVI/CVD, it will be understood that the conditions within the containment structure and process chamber (i.e., temperature, pressure and flow rate of reactant gas) may adjusted and controlled in a manner to conduct any type of CVI/CVD, such as pressure gradient CVI/CVD, isothermal CVI/CVD, and pulsed flow CVI/CVD, or any combination thereof.

For example, the process chamber may be used to conduct pressure gradient CVI/CVD by creating a pressure differential across the substrate to increase the deposition rate of the binding matrix. A vacuum or other suction device may be used to create a pressure gradient. A pressure gradient may also be created instead of, or in addition to, a temperature gradient.

The process chamber may be used to conduct isothermal CVI/CVD. For example, the substrate may be heated to a uniform temperature and the pressure of the containment structure may be lowered to cause the gas to flow into the substrate and deposit a binding matrix.

In one embodiment, the process chamber may be used to conduct pulsed flow CVI/CVD. For example, the flow rate of the reactant gas into the containment structure may be rapidly increased and decreased during the process to vary the concentration of reactant gas within the structure, thereby controlling the deposition of the binding matrix within the substrate.

During the CVI/CVD process, the density of the substrate may increase gradually as the process progresses and the composite structure is formed. The flow rate of the gas through the substrate may be reduced to maintain a substantially constant difference in pressure between the pressure of the two surfaces of the substrate. The temperature of the heating element may be decreased gradually while the temperature of the cooling element is increased. Alternatively, the temperature of the heating element may be increased gradually while the temperature of the cooling element is maintained constant. These parameters could be changed simultaneously during the CVD process.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A containment structure for transforming a substrate into a composite structure, the containment structure comprising:
   a support structure operable to support the substrate, wherein the substrate is annular;
   a first gas inlet operable to deliver a gas to an interior of the containment structure, the first gas inlet disposed on a bottom surface of the support structure;
   a second gas inlet operable to deliver the gas to the interior of the containment structure, the second gas inlet disposed on the bottom surface of the support structure, a gas outlet operable to remove the gas from the interior of the containment structure, the gas outlet disposed on the bottom surface of the support structure, the gas outlet disposed in between the first gas inlet anti the second gas inlet;
   a cover portion operable to be removably attached to the support structure so as to contain the substrate, wherein the cover portion includes a wall extending axially to enclose an outer diameter of the substrate and wherein the cover portion includes a continuous top portion;
   wherein, as assembled; the support structure and the substrate define (1) a first open space between the support structure and the substrate; and (2) a second open space between the cover portion and the substrate,
   a first spacer component positioned between the substrate and the cover portion to create the second open space, wherein the spacer component comprises a plurality of concentric castellated rings disposed between the substrate and the cover portion, wherein at least one concentric castellated ring in the plurality of concentric castellated rings has a diameter equal to a diameter of the substrate;
   a cooling element positioned beneath and in thermal communication with the support structure, the cooling element having an embedded cooling conduit to allow a fluid coolant to flow through the cooling element, the cooling element being thermally coupled to the bottom surface of the substrate support structure, wherein the cooling element comprises a plate having a surface in thermal communication with the support structure, said surface extending horizontally in a first direction, a position of the cooling element being adjustable with respect to the support structure so as to increase or decrease a third space between the position of the cooling element and the support structure, wherein the first gas inlet, the second gas inlet, and the gas outlet extend vertically in a second direction from below the surface of the plate to a location above the surface of the plate; and
   a diffuser component positioned between the support structure and the substrate, the diffuser component coupled to the support structure via bolts, the diffuser component having an opening, wherein the gas outlet is positioned coaxially with the diffuser component, wherein the first gas inlet and the second gas inlet are positioned radially outward of the gas outlet, and wherein the first gas inlet and the second gas inlet are positioned to provide the gas, which is delivered to the interior of the containment structure, from below the substrate, and where the gas outlet and the first gas inlet and the second gas inlet are located on a side of the containment structure below the substrate.

2. The structure of claim 1, further comprising a seal component operable to be positioned between the support structure and the cover portion.

3. The structure of claim 1, further comprising a cooling conduit located within at least one of the first gas inlet, the second gas inlet and the gas outlet, the cooling conduit operable for delivering a coolant gas to the top surface of the substrate.

4. The structure of claim 1, wherein the containment structure further comprises a cooling media inlet and a cooling media outlet, wherein a position of at least one of the cooling media inlet and cooling media outlet is adjustable to control the position of the cooling element.

5. The structure of claim 1, wherein, as assembled, the cover portion and the support structure completely enclose the substrate.

6. The structure of claim 5, wherein, as assembled, the containment structure is only in fluid communication with the first gas inlet, the second gas inlet and the gas outlet.

7. The structure of claim 1, wherein the gas outlet conducts gas outside a process chamber.

8. The structure of claim 1, wherein the substrate is an annular disk having a first axial length, and wherein the wall of the cover portion is cylindrically shaped, and wherein the wall of the cover portion has a second axial length, the second axial length being equal to or greater than the first axial length.

* * * * *